(12) United States Patent
Mizoguchi

(10) Patent No.: US 7,868,469 B2
(45) Date of Patent: Jan. 11, 2011

(54) ADAPTER BOARD AND METHOD FOR MANUFACTURING SAME, PROBE CARD, METHOD FOR INSPECTING SEMICONDUCTOR WAFER, AND METHOD FOR MANUFACTURING SEMICONDUCTOR DEVICE

(75) Inventor: Osamu Mizoguchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/320,261

(22) Filed: Jan. 22, 2009

(65) Prior Publication Data
US 2010/0009471 A1 Jan. 14, 2010

(30) Foreign Application Priority Data
Jul. 10, 2008 (JP) ............... 2008-180601

(51) Int. Cl.
*H01L 23/48* (2006.01)
*H01L 23/14* (2006.01)
(52) U.S. Cl. .............. 257/786; 257/702; 257/773; 257/E23.07
(58) Field of Classification Search ........... 257/702, 257/773, 786, 737, E23.07
See application file for complete search history.

(56) References Cited

U.S. PATENT DOCUMENTS

| 5,534,784 | A | 7/1996 | Lum et al. | |
|---|---|---|---|---|
| 5,693,565 | A | 12/1997 | Camilletti et al. | |
| 6,324,067 | B1 * | 11/2001 | Nishiyama | 361/761 |
| 6,351,031 | B1 * | 2/2002 | Iijima et al. | 257/698 |
| 7,329,899 | B2 * | 2/2008 | Farnworth et al. | 257/48 |
| 7,411,301 | B2 * | 8/2008 | Funakoshi et al. | 257/758 |
| 7,508,072 | B2 * | 3/2009 | Morita et al. | 257/737 |
| 2003/0057976 | A1 | 3/2003 | Deguchi | |
| 2003/0162386 | A1 * | 8/2003 | Ogawa et al. | 438/637 |
| 2008/0042292 | A1 * | 2/2008 | Adkisson et al. | 257/773 |

FOREIGN PATENT DOCUMENTS

| JP | 05-299420 | 11/1993 |
|---|---|---|
| JP | 7-301642 | 11/1995 |
| JP | 10-48298 | 2/1998 |
| JP | 10-98042 | 4/1998 |
| JP | 11-330297 | 11/1999 |

(Continued)

OTHER PUBLICATIONS

Japanese Office Action dated Aug. 18, 2009, with partial English translation.
Japanese Office Action dated May 11, 2010 (with partial English translation).

*Primary Examiner*—Nitin Parekh
(74) *Attorney, Agent, or Firm*—McGinn IP Law Group, PLLC

(57) ABSTRACT

An adapter board includes a package substrate having a first surface and a second surface and further including a board having wirings formed therein, pads disposed in the device side, and the pads disposed in the bump side, an insulating resin layer joined to the first surface, through holes formed in the positions corresponding to the pads in the insulating resin layer, vias formed in the through holes, and pads covering the through holes, wherein the pads are electrically coupled to the pads through the wirings, and the pads are electrically coupled to the pads through the vias.

9 Claims, 10 Drawing Sheets

FOREIGN PATENT DOCUMENTS

| | | |
|---|---|---|
| JP | 2000-12736 | 1/2000 |
| JP | 2000-227443 | 8/2000 |
| JP | 2003-107105 | 4/2003 |
| JP | 2004-152953 | 5/2004 |
| JP | 2006-303401 | 11/2006 |
| JP | 2007-171140 | 7/2007 |
| WO | WO 00/33096 | 6/2000 |

* cited by examiner 904  905

904  905

Related Art

Related Art

ADAPTER BOARD AND METHOD FOR MANUFACTURING SAME, PROBE CARD, METHOD FOR INSPECTING SEMICONDUCTOR WAFER, AND METHOD FOR MANUFACTURING SEMICONDUCTOR DEVICE

This application is based on Japanese patent application No. 2008-180,601, the content of which is incorporated hereinto by reference.

BACKGROUND

1. Technical Field

The present invention relates to an adapter board and a method for manufacturing thereof, a probe card and a method for inspecting a semiconductor wafer using thereof, and a method for manufacturing a semiconductor device.

2. Related Art

In recent years, high-density installation in a semiconductor device requires an increased number of lands disposed in one chip. In particular, configurations of flip-chip devices are advantageous for achieving an arrangement of larger number of lands, since such configurations allow installing lands in array-like patterns in both the periphery of the semiconductor device and additionally the entire surface of the semiconductor device.

In such flip-chip devices, bumps are formed on the lands, which are formed on the semiconductor element via a semiconductor process, by printing, vapor deposition, plating processes or the like. A dicing process is conducted for the obtained product, and then the diced products are installed on the package substrate via a reflow soldering process to complete the production of the device.

An operability of a semiconductor device for a desired operation is required to be checked in a wafer-condition. A large scale integration (LSI) tester is a device for applying electrical signal to a semiconductor wafer having LSI formed therein and determining whether the signal from the LSI to be tested is a desired signal or not. A probe card is a tool utilized between a LSI tester and a semiconductor wafers and serves as transferring electrical signal. Typical probe card includes a probe card board for providing a coupling with a LSI tester and probes for providing contacts with lands on the semiconductor wafer.

In the case of the flip-chip device, the probes are required to be arranged in a probe card board in an array-like pattern with the same spacing as the spacing for the lands in the semiconductor wafer. In addition, a number of lands cause narrower inter-pad distance. When a testing of an LSI for such flip-chip device is conducted, electric contacts are assured by pushing the probes over bumps formed in the lands on the semiconductor wafer.

Coupling terminals that provides coupling to an LSI tester are required to be arranged around the circumference of the surface of the probe card board at predetermined spacing. In addition, coupling terminals that provides coupling to the probes are required to be arranged around the center of the back surface of the probe card board in the same arrangement as employed for the lands on the semiconductor wafer. Therefore, it is concluded that, when the inter-probe distance or probe spacing is different from the inter-terminal distance or terminal spacing for the coupling terminals in the LSI tester, it is necessary to provides a matching of the spacing in the probe card board.

To solve the problem, either a wiring-system or an adapter board-system is employed for converting the spacing.

In the wiring-system, wires are laced through the board, which includes through holes corresponding to the spacing of the land pads in the semiconductor device, and the wires are cut and polished in the back surface of the board, and the cross sections of the wires are employed as the land pads in the side of the probes. The other ends of the wires are connected to the probe card board to obtain the coupling between the LSI tester and the probe.

In the case of employing the wiring system, all the procedures for electric wirings are made by manual works of workers. Limited number of electric wirings is available in the wiring system by such reasons, and more specifically the upper limit would be about 2000 pins.

Therefore, when more pads are required, the use of the adapter board system is required. In order to manufacture land pads that accommodates narrower inter-pad distance of several hundred micrometers, ceramic boards or built-up boards are generally employed for the base material in the adapter board system. The set of the land pads are formed in the side of the back surface of the adapter board at the same spacing as employed in the semiconductor device, and the other set of the land pads are formed in the side of the front surface thereof at the spacing of about 1 mm, and wiring couplings are made between the set of land pads in the side of the back surface and the set of the land pads in the side of the front surface in the inside of the adapter board.

Technologies disclosed in Japanese Patent Laid-Open No. H07-301,642 (1995), Japanese Patent Laid-Open No. 2007-171,140 and Japanese Patent Domestic Publication for PCT Application 2002-531,836 are typically known as probe cards employing the adapter board system.

However, the conventional technologies described above are needed to be improved in the following reasons. More specifically, new adapter board dedicated for the product must be designed in accordance with the arrangement of the pads specified for the product. Ceramics boards and the built-up boards, which are the materials for the base material in the adapter board system, are expensive, and therefore the adapter board system is not advantageous in terms of the costs.

To solve the problem, the technology employing the package substrate of the device as the adapter board has been developed, as described in Japanese Patent Laid-Open No. H07-301,642. The use of the package substrate for the adapter board allows reducing the cost for designing the dedicated board for the device. FIG. 8 shows an exemplary implementation that employs a package substrate for an adapter board. In this example, the configuration of utilizing the product package substrate of the associated device for the adapter board is employed.

On the other hand, the alignment of the land pads of the device with the probes is difficult in the case of the simple utilization of the package substrate of the device for the adapter board.

The situation will be fully described in reference to FIGS. 9A and 9B. FIGS. 9A and 9B illustrate an exemplary implementation of a conventional adapter board that utilizes a package substrate. FIG. 9A shows a cross-sectional view of a conventional adapter board, and FIG. 9B is an enlarged diagram of a portion surrounded by a dotted line in FIG. 9A. A resist 701 is applied over a surface in the side of the testing object of the adapter board 706 (device side in FIG. 9). Since the resist 701 covers the circumference portions of the pads 303, the dimensions of the openings, which are capable of being in contact with the probes, are slightly smaller than the original dimensions of the pads. The trend of reduced inter-pad distance in the semiconductor element provide smaller dimension of the opening of the pad. Therefore, the accuracy required for aligning the pads on the adapter board with the probes are extremely high, and thus the use of such technology is difficult.

In addition, the larger thickness of the resist 701 causes the recessed feature of the pads 303 from the surface of the package substrate. Thus, the upper end of the probe interferes 701 the portion of the resist, causing a concern of deterioration of the nature of the contacts between the probes and the land pads.

SUMMARY

According to one aspect of the present invention, there is provided an adapter board, comprising: a package substrate, including a board body having a first surface and a second surface and also having a wiring formed in the interior thereof, a first land pad disposed in the first surface and a second land pad disposed in the second surface; an insulating layer formed on the first surface of the package substrate; a through hole formed in a position corresponding to the first land pad of the insulating layer; a conductive member formed in the through hole; a third land pad covering the through hole and having a bump side without being covered with the insulating layer; and an external coupling terminal formed in the second land pad, wherein the first land pad is electrically coupled to the second land pad through the wiring, and wherein the third land pad is electrically coupled to the first land pad through the conductive member.

According to another aspect of the present invention, there is provided a probe card, being capable of electrically coupling a semiconductor wafer to an measuring apparatus, the semiconductor wafer having a large scale integrated circuit (LSI) formed therein, which is an object of a testing, and the measuring apparatus applying electrical signal to the LSI formed in the semiconductor wafer to measure electrical characteristics of the LSI formed in the semiconductor wafer, the probe card comprising: an adapter board including: a package substrate, including a board body having a first surface and a second surface and also having a wiring formed in the interior thereof, a first land pad disposed in the first surface and a second land pad disposed in the second surface; an insulating layer formed on the first surface of the package substrate; a through hole formed in a position corresponding to the first land pad of the insulating layer; a conductive member formed in the through hole; a third land pad covering the through hole and having a bump side without being covered with the insulating layer; and an external coupling terminal formed in the second land pad; and a probe, being electrically coupled to the third land pad in contact with the land formed in the semiconductor wafer, wherein the first land pad is electrically coupled to the second land pad through the wiring, and the third land pad is electrically coupled to the first land pad through the conductive member.

According to further aspect of the present invention, there is provided a method for manufacturing an adapter board, comprising: preparing a package substrate including a board body having a first surface and a second surface and also having a wiring formed in the interior thereof, a first land pad disposed in the first surface and a second land pad disposed in the second surface; forming an insulating layer in the first surface; forming a through hole in a position corresponding to the first land pad of the insulating layer; forming a conductive member in the through hole; covering the through hole with a third land pad; and forming an external coupling terminal in the second land pad, wherein the first land pad is electrically coupled to the second land pad through the wiring, wherein the third land pad is electrically coupled to the first land pad through the conductive member, and has a bump side without being covered with the insulating layer.

According to yet other aspect of the present invention, there is provided a method for inspecting a semiconductor wafer, using a probe card, being capable of electrically coupling a semiconductor wafer to an measuring apparatus, the semiconductor wafer having a large scale integrated circuit (LSI) formed therein, which is an object of a testing, and the measuring apparatus applying electrical signal to the LSI formed in the semiconductor wafer to measure electrical characteristics of the LSI formed in the semiconductor wafer, the probe card comprising: an adapter board, including a package substrate including a board body having a first surface and a second surface and also having a wiring formed in the interior thereof, a first land pad disposed in the first surface and a second land pad disposed in the second surface; an insulating layer formed on the first surface of the package substrate; a through hole formed in a position corresponding to the first land pad of the insulating layer; a conductive member formed in the through hole; a third land pad covering the through hole and having a bump side without being covered with the insulating layer; and an external coupling terminal formed in the second land pad, the adapter board providing an electric coupling between the first land pad and the second land pad; and a probe, being electrically coupled to the third land pad and in contact with the land formed in the semiconductor wafer, wherein the method comprises: causing the probe in contact with the land provided in the semiconductor wafer; and applying electrical signal to the semiconductor wafer to measure electrical characteristics of the semiconductor wafer.

According to yet other aspect of the present invention, there is provided a method for manufacturing a semiconductor device, comprising: preparing two package substrates, each including a board body having a first surface and a second surface and also having a wiring formed in the interior thereof, a first land pad disposed in the first surface and a second land pad disposed in the second surface; electrically coupling a semiconductor wafer to an measuring apparatus, the semiconductor wafer having a large scale integrated circuit (LSI) formed therein, which is an object of a testing, and the measuring apparatus applying electrical signal to the LSI formed in the semiconductor wafer to measure electrical characteristics of the LSI formed in the semiconductor wafer; inspecting the semiconductor wafer by using a probe card having one of the prepared two package substrates; dicing the semiconductor wafer into semiconductor elements containing the LSI; and packaging the semiconductor element over the other of the prepared two package substrates, wherein the probe card includes: an adapter board including: the one of the package substrates; an insulating layer formed on the first surface of the one of the package substrates; a through hole formed in the position corresponding to the first land pad of the insulating layer; a conductive member formed in the through hole; a third land pad covering the through hole and having a bump side without being covered with the insulating layer; and an external coupling terminal formed in the second land pad; and a probe, being electrically coupled to the third land pad included in the adapter board and in contact with the land formed in the semiconductor wafer; wherein the inspecting the semiconductor wafer includes: electrically coupling the third land pad to the land by causing the probe into contact with the land provided in the semiconductor wafer; and applying electrical signal from the measuring apparatus to the semiconductor wafer to measure electrical characteristics of the semiconductor wafer, wherein packaging the semiconductor element includes installing the semiconductor element in the first surface of the other package substrate, providing an electric coupling of the semiconductor element with the first land pad of the other package substrate; and forming an external coupling terminal over the second land pad of the other package substrate.

According to the configuration of the present invention, an additional insulating layer is provided to the package substrate, so that a conductive member is formed in the through hole formed in the position corresponding to the first land pad of said insulating layer to cover the through hole with the third land pad. This allows supporting the third land pad by the insulating layer and the conductive member, achieving a creation of a coupling of the first land pad with the third land pad through the conductive member. Therefore, sufficient contact area with the probe can be assured by the presence of the third land pad, while utilizing the first land pad formed in the package substrate, allowing an easy alignment of the probes with the land pads and a prevention of a misalignment during the inspection. Thus, a reduction of the cost can be achieved even if the adapter board system is adopted, so that electrical characteristics of the semiconductor wafer having LSI formed therein can be inspected with an improved efficiency.

Here, the condition of "being formed over the first surface" in the present invention represents the condition of an object being formed over the first surface when the second surface having the second land pad disposed therein is disposed in the upper side and the first surface having the first land pad disposed therein is disposed in the lower side.

In addition, the condition of "bump side without being covered with the insulating layer" in the present invention represents the condition of the bump side that is not covered with the insulating layer, when the second surface having the second land pad disposed therein is disposed in the upper side and the first surface having the first land pad disposed therein is disposed in the lower side.

In addition, various types of components of the present invention are not necessary to be respectively independent objects, and a plurality of components may be presented to form a single member, a single component may be formed of a plurality of members, a certain component may compose a portion of another component, or a portion of a certain component may compose a portion of the other component.

In addition, while a plurality of operations are described to be conducted in series in a certain order in the method for manufacturing the adapter board and the method for inspecting the semiconductor wafer of the present invention, it is not intended to particularly limit the order of a plurality of operations to be conducted by the order of the respective operations described here. Consequently, when the method for manufacturing the adapter board of the present invention is conducted, the order of plurality of operations may be changed unless an obstacle is caused.

Further, it is not intended to particularly limit the situation that each of the operations in the method for manufacturing the adapter board and the method for inspecting the semiconductor wafer according to the present invention is independently carried out alone. Consequently, a certain operation may be simultaneously conducted during the other operation, or the timing of running a certain operation and the timing of running another operation may be partially or wholly coincident.

According to the present invention, the adapter boards and the probe cards are provided, which can be manufactured at lower costs and facilitates an alignment even though the adopting adapter board system is employed, and can provide prevention for deterioration of the contact between the probe and the land pad.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated.

Figure 1A:
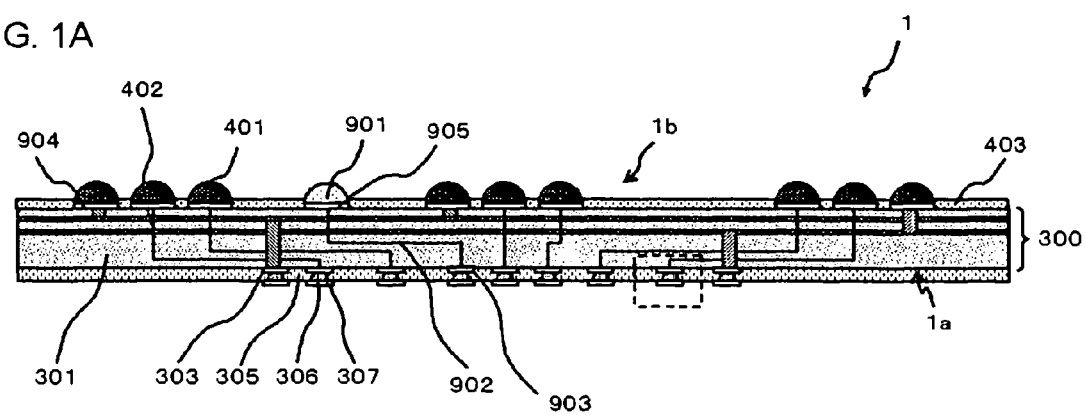
FIGS. 1A and 1B are cross-sectional views, schematically illustrating an adapter board according to an embodiment of the present invention.
Figure 1B:
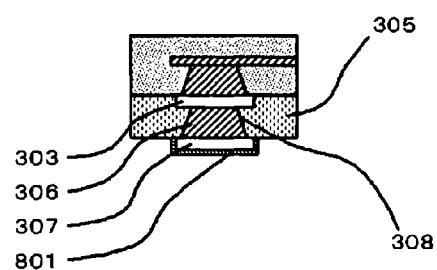
Figure 2A:
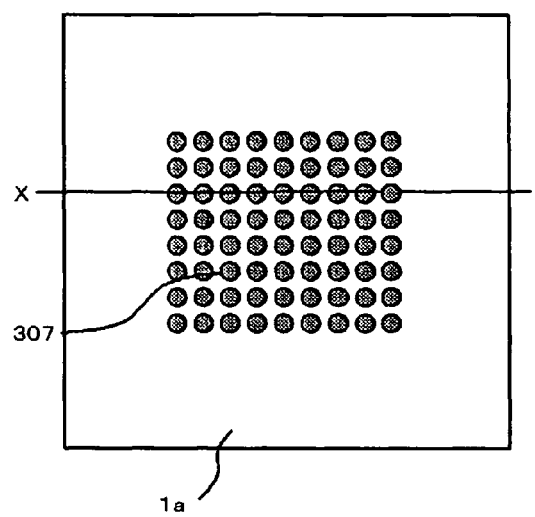
FIGS. 2A and 2B are plan views, schematically illustrating an adapter board according to an embodiment.
Figure 2B:
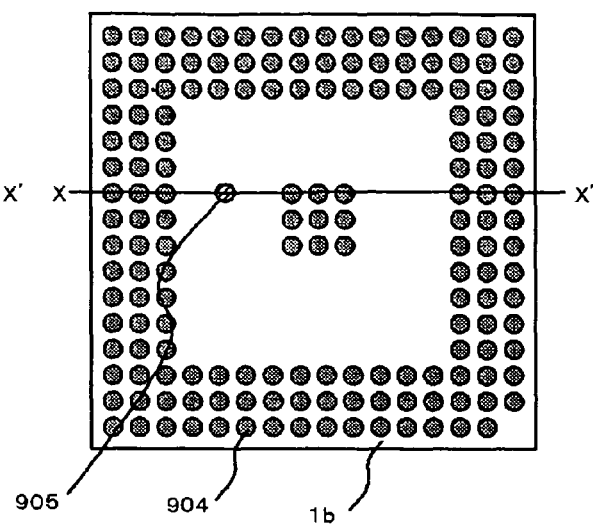

FIGS. 2A and 2B are plan views, schematically illustrating an adapter board 1 of the present embodiment. FIGS. 1A and 1B are cross-sectional views along line X-X' in FIGS. 2A and 2B. The adapter board 1 of the present embodiment includes a package substrate 300, an insulating resin layer 305 formed on the device side 1a of the package substrate 300, through holes 308 formed in locations corresponding to pads 303 and 903 (first land pads) of the insulating resin layer 305, respectively, vias 306 (conductive members) formed in the through holes 308, pads 307 (third land pads) covering the through holes 308 and having the bump sides without being covered with an insulating layer, and external coupling terminals 401 formed in pads 904. The package substrate 300 has a first surface (device side 1a in FIG. 1) and a second surface (bump side 1b in FIG. 1), and further includes a board 301 (board body) having wirings 402 and 902 formed therein, the pads 303 and 903 disposed in the device side 1a, and the pads 904 (second land pad) disposed in the bump side 1b. The pads 303 are electrically coupled to the pads 904 through the wirings 402, and the pads 307 are electrically coupled to the pads 303 through the vias 306. The bump side of the pad 307 is not covered with the insulating resin layer 305 or a layer of other insulating material such as solder resist and the like.

In addition, the adapter board 1 has a testing-dedicated pad 905 (second testing-dedicated pad) that is to be applied with electrical signal in the bump side 1b of the package substrate 300. The package substrate 300 also has a testing-dedicated pad 903 (first testing-dedicated pad) in the device side 1a. The testing-dedicated pad 903 is is electrically coupled to the testing-dedicated pad 905 through the wiring 902. An external coupling terminal 901 is formed in the testing-dedicated pad 905. The testing-dedicated pad is a dedicated terminal, which is essential for applying specified electrical signal from a LSI tester, when an LSI testing is conducted for an LSI formed in the semiconductor wafer. The external coupling terminals 401 and 901 may be composed of, for example, solder bumps.

The package substrate 300 may be composed of, for example, a printed package substrate having a multiple-layered wiring layer. While various types of resins may be employed for the board 301, glass epoxy resin, for example, may be typically employed. The bump side 1b of the board 301 may also be covered with an electrically insulating protective film 403. The electrically insulating protective film 403 may be composed of, for example, solder resist.

The pad 307 may be covered with an electroconductive protective film 801. For example, the electroconductive protective film 801 may be composed of a gold-plated film. FIG. 1B is an enlarged view of a portion surrounded with a dotted line of FIG. 1A. Gold and silver may be typically exemplified for materials of the electroconductive protective film 801. The use of gold achieves enhanced contact with probe terminals, which are in contact with the lands on the semiconductor wafer. Further, lower oxidization and enhanced abrasion-resistance are also achieved. Adequate selection of the gold-plated material allows achieving an enhanced contact with, and an enhanced abrasion-resistance for, copper and solder. The preferable thickness thereof may be 0.1 μm to 1 μm.

The material for the pads 303, 307 and 904 may be copper, nickel or the like. Similarly, the material for the testing-dedicated pads 903 and 905 may also be copper, nickel or the like.

The pad 307 may be configured to have a convex geometry protruded over the surface of the insulating resin layer 305. Other geometry such as a circle or a rectangle may alternatively be employed for the pad 307.

Further, the dimensional area of the pad 307 may be larger than the dimensional area of the pad 303, as long as the spacing between the pads is accommodated. It may be configured that the spacing between the pads 904 is larger than the spacing between the pads 303 and that the spacing between the pads 307 are equivalent to the spacing between the pads 303. Having such configuration, the spacing conversion is made on the package substrate 300 or in other words between the pads 904 and pads 303, and the pads 307 allow to facilitate the alignment and to prevent a deterioration of the contact between the probe and the land pad.

The insulating resin layer 305 may be formed of polyimide, benzocyclobutene (BCB), epoxy resin, fluororesin and the like. For example, resins such as a commercially available ABF resin or a resin coated copper foil (RCC) may be available. Materials having smaller thermal expansion may be more preferably employed for the insulating resin layer 305.

Figure 3:
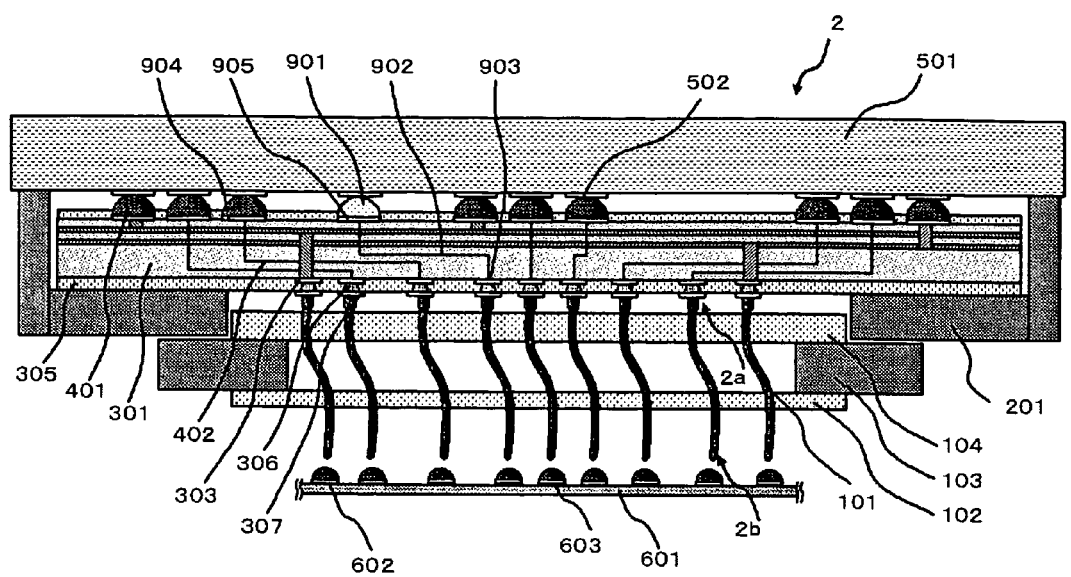
FIG. 3 is a cross-sectional view, schematically illustrating a probe card according to an embodiment.

An exemplary implementation employing adapter board 1 thus configured will be described in reference to FIG. 3. FIG. 3 is a cross-sectional view, schematically illustrating a probe card 2 employing an adapter board 1 of the present embodiment.

The probe card 2 provides an electrical coupling of the semiconductor wafer 601 having LSIs formed therein serving as objects of the testing to the measuring apparatus (not shown), which is capable of applying electrical signal to the LSI formed in the semiconductor wafer 601 to measure electrical characteristics of the LSI formed in the semiconductor wafer 601. The probe card 2 includes the adapter board 1 and probes 101 that provide electrical couplings to the pad 307 included in the adapter board 1 and are in contact with the lands 602 formed in the semiconductor wafer 601.

The probes 101 are regularly arranged at the spacing equivalent to the spacing between the lands 602 disposed on the semiconductor wafer 601 that is the object of the measurement. The spacing is about 125 μm to 250 μm. An alloy composed of noble metals or a member having a springability composed of a nickel-plated or gold-plated iron base metal having a diameter of about 30 μm to 120 μm may be employed for the probe 101.

The probe card 2 further includes a probe card board 501. The probe card board 501 is installed to the side of the bump side 1b of the adapter board 1.

The probe card 2 is a tool for applying signal from an LSI tester to the semiconductor wafer 601 and vice versa. Thus, the spacing between the bumps 603 formed in the semiconductor wafer 601 must be extended to a spacing that allows coupling to the LSI tester in the case of the probe card 2. The electrode pole of the LSI tester has the spacing of about 1 mm to 2 mm. The LSI tester is directly coupled to the probe card board 501.

A printed package substrate may be employed for the probe card board 501. Such printed circuit board has a circular geometry having a diameter of about 25 cm to 45 cm, or a rectangular geometry having a width of about 25 cm to 45 cm. The probe card board 501 may be manufactured by preparing copper-wiring within an organic material such as glass epoxy resin, polyimide resin and the like. Coupling terminals 502 coupled to the LSI tester are arranged around the periphery of the surface of the probe card member at about 1 mm to 2 mm pitch. The inter-pad distance may be converted to about 0.8 mm to 1.27 mm by employing the probe card board 501. Further, the adapter board 1 may be employed to achieve the conversion of the spacing to the equivalent inter-pad distance that the semiconductor wafer 601 has.

The pads 303 and 307 are arranged in the side of the device side 1a of the adapter board 1 at the same inter-pad distance as employed in the semiconductor wafer 601. The pads 904 are arranged in the side of the bump side 1b at the same inter-pad distance as employed for the pads 502 on the probe card board 501. The both sets of the pads are coupled via the wirings 402 within the package substrate 300. The electric coupling between the package substrate 300 and the probe card board 501 is achieved by providing electrical couplings of the pads 502 with the respective pads 904 and the testing-dedicated pads 905 via a method such as reflow soldering and the like.

Electrical conduction between the adapter board 1 and the probes 101 are achieved by pressing the end sections of the probes 101 (upper end sections 2a in FIG. 3) against the pads 307. The probes 101 are maintained by the guide plates 102 and 104. The guide plates 102 and 104 are provided with openings having a diameter slightly larger than the diameter of the probes 101 in the same positions as the probes 101 are located. The probes are extended through the opening of the board to provide the retention and the alignment of probes 101.

Here, the combination of the probes 101, the guide plates 102 and 104, and the spacer 103 are generally called as a "probe head". The probe head is employed to be fixed to a plate 201 installed on the probe card board 501 with screws or the like. The probe is required to be aligned to be fixed so that the positions of the upper end sections 2a of the probes 101 meet the position of the pads 307 on the package substrate 300. In such case, as shown in FIG. 3, it is configured that the upper end section 2a of the probe 101 is pressed against the pads 307.

Figure 7:
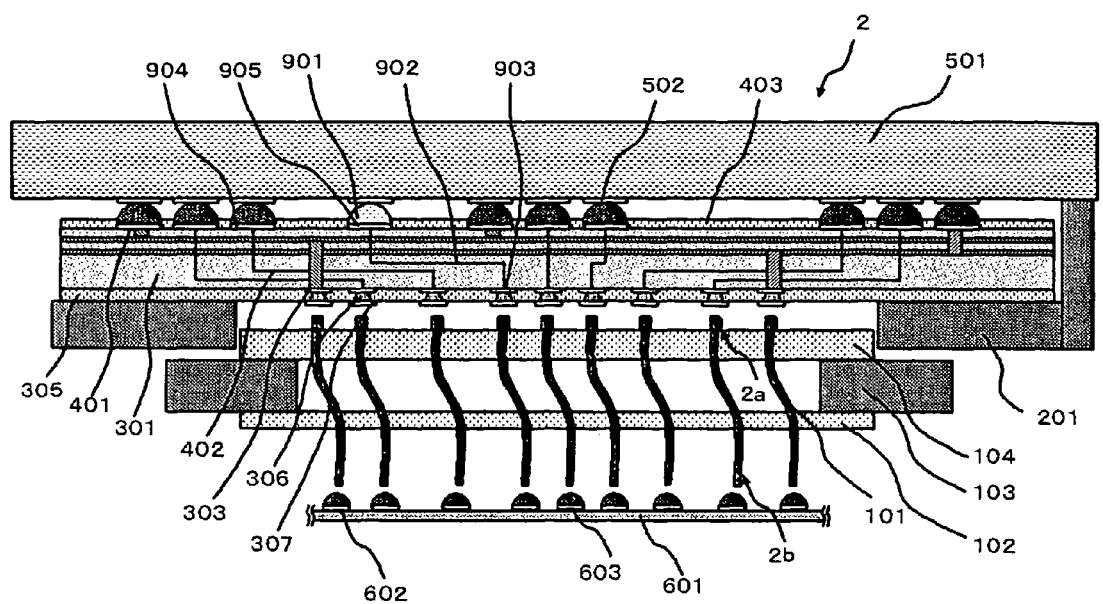
FIG. 7 is a cross-sectional view, schematically illustrating a modified embodiment of a probe card according to an embodiment.
Figure 8:
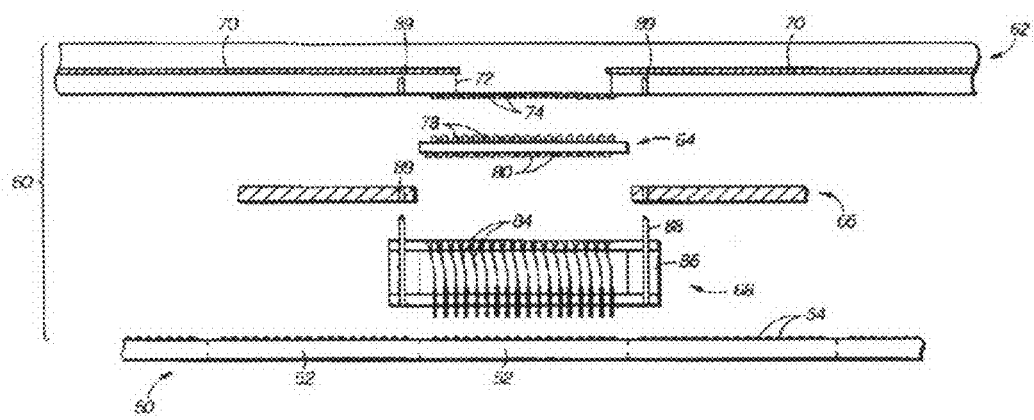
FIG. 8 illustrates an example of a conventional adapter board.

Further, the probe card 2 may be in a floating condition as shown in FIG. 7, before the probes 101 are coupled to the lands in the semiconductor wafer, and may also be electrically coupled to the pads 307 after the probes are coupled to the lands in the semiconductor wafer. Here the "floating condition" means a condition, in which the probes 101 are not pressed against the pads 307.

If the land pads 307 are covered with the electroconductive protective films 801, the contacts with the probes 101 are enhanced. The use of gold for the electroconductive protective films 801 provides more improved contact with the probe terminals that are in contact with the lands on the semiconductor wafer.

Further, the configuration of the pads 307 being protruded from the surface of the insulating resin layer 305 may be employed. Having such configuration, a misalignment is prevented to avoid the situation where the end surface of the upper end section 2a of the probe 101 does not completely overlap the surface of pad 307, so that the end surface of the upper end section 2a and the surface of the pad 307 are prevented to be open. Therefore, requirements for the probe position accuracy and the accuracy for installation alignment of the pads and the probes are reduced.

Further, it may be also configured that a dimensional area of the pad 307 is larger than a dimensional area of the pad 303. Having such configuration, increased contacting area with the probes 101 can be ensured, achieving an easy alignment of the adapter board 1 with the probes 101 in the side of the probe card board 501. Further, the configuration provides easily ensuring the contact between the probes 101 and the pads 307, even if a relative position is changed due to deterioration with age.

Further, it may also be configured that the inter-pad distance for the pads 904 are larger than the inter-pad distance for the pads 303, and the inter-pad distance of the pads 307 is equivalent to the inter-pad distance of the pads 303. Having such configuration, the package substrate 300 may be employed to achieve the conversion of the inter-pad distance. In other words, the conversion of the inter-pad distance can be conducted between the pads 904 and the pads 303. Then, easy alignment is achieved by the pads 307 and a deterioration in the contact between the probes 101 and the pads 307 is avoided.

Subsequently, the method for inspecting the semiconductor wafer 601 employing such probe card 2 will be described. The method for the inspection includes causing the probes 101 in contact with the lands 602 provided in the semiconductor wafer 601 employing the probe card 2, and applying electrical signal to the semiconductor wafer 601 to measure electrical characteristics of the semiconductor wafer 601. Such method allows the pads 303 being electrically coupled to the pads 904 through the wirings 402, and the pads 307 being electrically coupled to the pads 303 through the vias 306.

Alternatively, before causing the probes 101 in contact with the lands 602 provided in the semiconductor wafer 601, the probes 101 may be in a floating condition over the pads 307 as shown in FIG. 7. Thereafter, the probes 101 may be in contact with the lands 602 by pressing the probes 101 against the pads 307.

The procedure for conducting such electrical testing will be specifically described as follows. In the following description, a flip-chip device of a wafer condition will be represented as the semiconductor wafer 601.

The probe card 2 as shown in FIG. 3 is installed to a bump side of a device called prober, and an LSI tester and the probe card 2 are electrically coupled. The semiconductor wafer 601 (wafer) as an object for the measurement is disposed on a stage of the prober, and an alignment for XYZ-directions for the bumps 603 formed on the lands 602 of the semiconductor wafer 601 is conducted over the position of the end section of the probes 101 in the probe card (bottom end 2b in FIG. 3). Then, the stage is lifted up to press the bumps 603 of the semiconductor wafer 601 against the probes 101 of the probe card. When probes 101 are fixed under the floating condition, the upper end sections 2a of the probes 101 are then pressed against the pads 307 to obtain electric conduction. Once such situation is reached, the LSI tester is electrically coupled to the semiconductor wafer 601 through the bumps 603 and the probes 101. This allows conducting inspections by applying/detecting electrical signal to the LSI tester.

The electrical signal entered from the measuring apparatus is applied to the semiconductor wafer 601 via the testing-dedicated pad 905, the testing-dedicated pad 903, vias 306 and the pads 307. Further, the electrical signal entered from the measuring apparatus is applied to the semiconductor wafer 601 through the pads 904, the pads 303, the vias 306 and the pads 307.

Figure 4A:
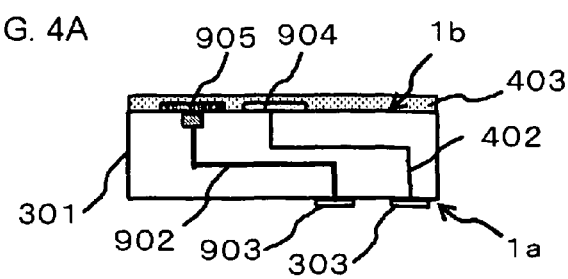
FIGS. 4A to 4F are diagrams, useful in describing a method for manufacturing an adapter board according to an embodiment.

Subsequently, a method for manufacturing the adapter board 1 will be described in reference to FIGS. 4A to 4F. First of all, a package substrate is prepared (FIG. 4A). The package substrate includes the board 301 having a first surface (device side 1a in FIG. 4A) and a second surface (bump side 1b in FIG. 4A) and having wirings 402 and 902 formed in the interior thereof, the pads 303 disposed in the device side 1a, and the pads 904 disposed in the bump side 1b. Further, the package substrate is also provided with the testing-dedicated pad 903 formed in the device side 1a and the testing-dedicated pad 905 formed in the bump side 1b. The testing-dedicated pad 903 couples to the testing-dedicated pad 905 through the wiring 902.

Here, when the LSI testing for the semiconductor wafer 601 is conducted, a terminal (pad) dedicated for the testing may be often employed. Since the terminal dedicated for the testing is not used in the finished product, such terminal is not wired on the package substrate. Therefore, when the package substrate is utilized as an adapter board, it is necessary to previously provide the terminals dedicated for the testing on the package substrate.

Then, the testing-dedicated pads 903 and 905 are previously formed on the package substrate in the adapter board 1, and the wirings 902 corresponding to such pads are prepared. However, the testing-dedicated pads 903 and 905 are originally unwanted in the status after the package assembly. Thus, the testing-dedicated pad 905 in the side of the bump side 1b (probe card board 501-side) may be desired to be located in the position where the bump cannot be disposed due to the reason of the installation integrity problem, or more specifically, for example, near the package center except the position right under the device or the package corner.

Figure 4D:
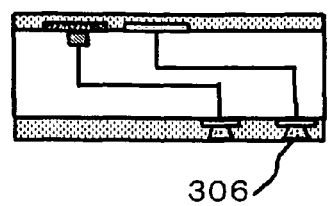
Figure 4B:
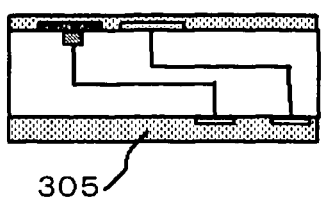

Subsequently, the insulating resin layer 305 is formed in the device side 1a (FIG. 4B).

Thereafter, a laser processing is conducted to form the through holes 308 in the positions corresponding to the pads 303 and the testing-dedicated pad 903 of the insulating resin layer 305 (FIG. 4C), and the vias 306 are formed in the through holes 308 (FIG. 4D).

Figure 4E:
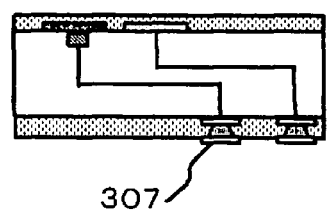
Figure 4C:
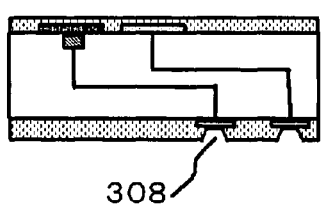

Subsequently, the pads 307 are formed via a plating process to cover the through holes 308 (FIG. 4E). Copper, for example, is employed for the material of the pad 307, and the thickness may be selected to be about 10 µm.

Figure 4F:
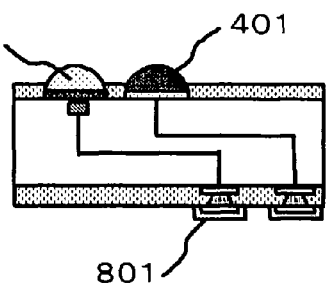

Finally, the surfaces of the pads 307 are plated by an electrolytic plating process to form the electroconductive protective film 801. For example, when the gold-plated film is formed as the electroconductive protective film, the surfaces of the pads 307 are electrolytically plated via a gold plating process to form gold-plated films having a thickness of about 1 µm. Then, the external coupling terminals 401 are installed to the pads 904, and the external coupling terminals 901 are installed to the testing-dedicated pads 905. This provides the finished product of the adapter board 1 (FIG. 4F).

In addition to above, when a semiconductor device is installed to the package substrate 300, the pads 303 are solder-plated after the operation illustrated in FIG. 4A, and then a resist-coating/forming process is conducted. While the testing-dedicated pad 905 is provided in the package substrate 300 for installing the semiconductor element, no external coupling terminal 901 is installed on the testing-dedicated pad 905. The lands of the semiconductor element manufactured by a semiconductor process are provided with bumps via a printing, a vapor deposition or a plating operation. This is diced, and then is installed via a reflow soldering operation on the package substrate, and then an underfill resin is injected therein to provide a finished product of the semiconductor device (flip-chip device).

Figure 5A:
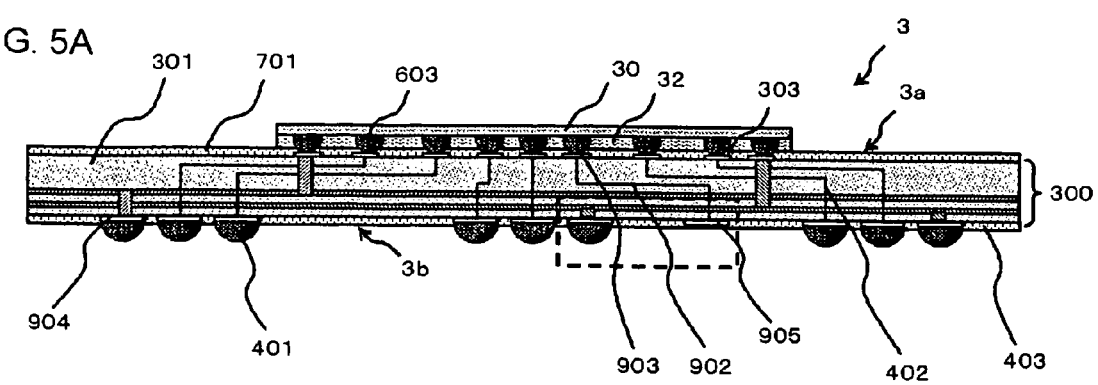
FIGS. 5A and 5B are cross-sectional view, schematically illustrating a semiconductor device according to an embodiment.
Figure 5B:
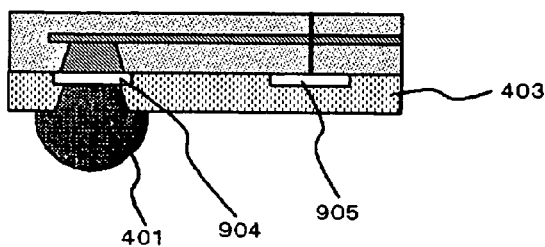
Figure 6A:
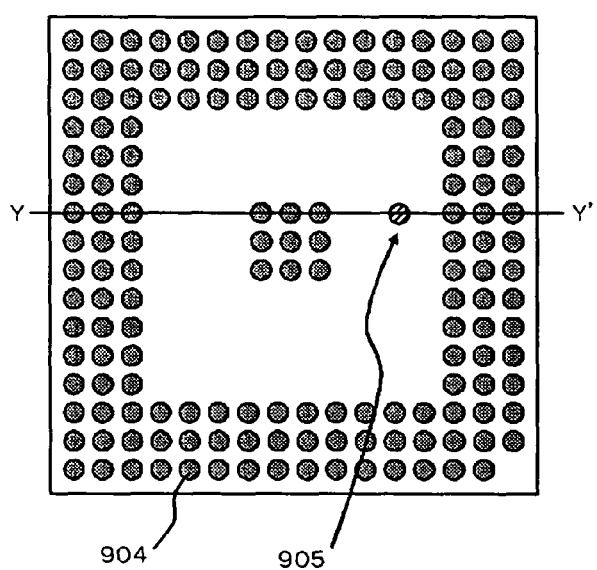
FIGS. 6A and 6B are plan views, schematically illustrating a semiconductor device according to an embodiment.
Figure 6B:
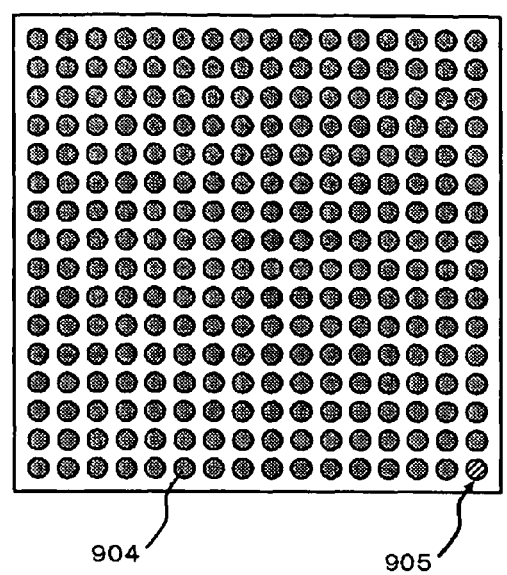

A semiconductor device 3 having the package substrate 300 including a semiconductor element 30 installed therein is shown in FIGS. 5A and 5B and FIGS. 6A and 6B. FIGS. 6A and 6B are plan views of the semiconductor device 3, and FIGS. 5A and 5B are cross-sectional views of the semiconductor device 3 shown in FIG. 6A along line Y-Y'. FIG. 5B is an enlarged view of a portion surrounded by a dotted line in FIG. 5A. The semiconductor device 3 includes the package substrate 300 utilized in the manufacture of the adapter board 1 and the semiconductor element 30 installed in the package substrate 300. The package substrate 300 includes a board 301 having the wirings 402 and 902 formed therein and having a first surface (device side 3a in FIG. 5) and a second surface (bump side 3b in FIG. 5), the pads 303 disposed in the device side 3a (first land pad), the pads 904 disposed in the bump side 3b, and the testing-dedicated pad 903 in the device side 3a. The pads 303 are electrically coupled to the pads 904 through the wirings 402, and none of the external coupling terminal 901 is present in neither of the testing-dedicated pad 903 in the device side 3a and the the testing-dedicated pad 905 on the bump side 3b that it is electrically coupled through the wiring 902. The device side 3a is covered with a resist 701. The external coupling terminal 401 may be, for example, of a solder bump.

The semiconductor element 30 has bumps 603 that are coupled to the pads 303. The spaces between semiconductor device 30 and resist 701 are filled with an underfill resin 32. The semiconductor device 30 is a semiconductor chip obtained by segmenting the semiconductor wafer 601 into pieces.

FIGS. 6A and 6B are plan views in the side of the device side 3b of the semiconductor device 3. Since the package substrate 300 is also utilized as the adapter board 1, the testing-dedicated pad 903 and the testing-dedicated pad 905 corresponding thereto are previously prepared. While the testing-dedicated pad 905 is formed in the external coupling terminal 901 in the adapter board 1 As shown in FIG. 1, the testing-dedicated pad 905 is not employed in the condition after the package assembly. Thus, as shown in FIG. 6A, the testing-dedicated pad 905 is disposed in the portion without the pads 904. This allows preventing adversely affecting a reliability for the installation by the testing-dedicated pad 905.

In addition to above, the package substrate 300 is designed to maintain only one of the corners without disposing the external coupling terminal 401, for the purpose of preventing an error in the installing orientation for the installation of the semiconductor element 30. Thus, as shown in FIG. 6B, the testing-dedicated pad 905 is installed in the position corresponding to such one of the corners, when the arrangement is fulfilled with the pads 904.

More specifically, the semiconductor device 3 may be manufactured by the following procedures.

(1) An operation for preparing two package substrates as shown in FIG. 4A. One is a package substrate for a probe card-installation, and the other is a package substrate for a semiconductor device-installation.

(2) An operation for inspecting the semiconductor wafer 601 by employing the probe card 2 as shown in FIG. 3.

(3) An operation for dicing the semiconductor wafer 601 into the semiconductor devices including LSIs. The semiconductor element 30 may be manufactured by a semiconductor process. The lands (not shown) of the semiconductor device 30 in a wafer condition are provided with bumps 603 via a printing, a vapor deposition or a plating operations. This is diced into pieces to obtain the semiconductor devices 30 (semiconductor chips). Concerning the semiconductor device 30, the selected semiconductor device having the LSI that has been passed as non-defective in the inspection in the electrical testing for the semiconductor wafer 601 can be packaged.

(4) An operation for packaging the semiconductor device on the package substrate prepared for installing the semiconductor device in the above-described operation (1).

The operation for packaging the semiconductor device in the above-described operation (4) further includes the following operations.

Figure 10A:
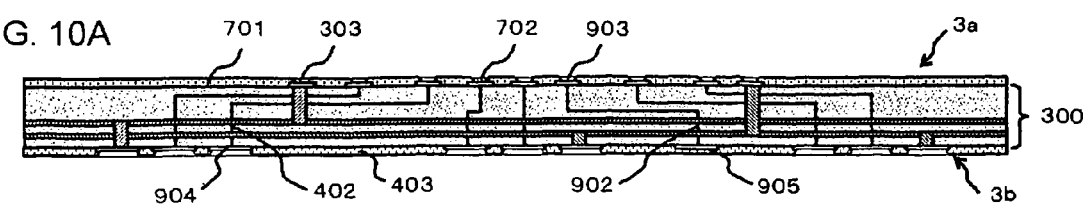
FIG. 10A to 10D is a diagram, useful in describing a method for manufacturing a semiconductor device according to an embodiment of the present invention.
Figure 10B:
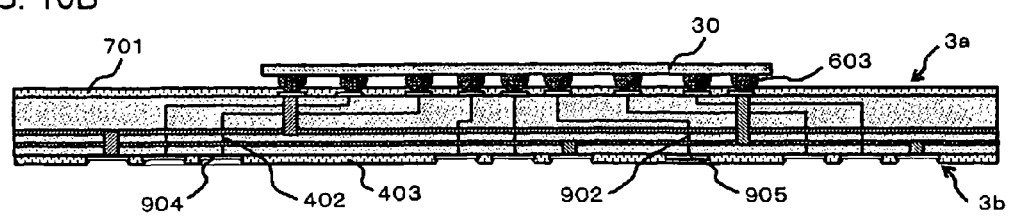

(i) An operation for installing the semiconductor device to the device side 1a of the package substrate as shown in FIG. 4A, and then electrically coupling the semiconductor element to the pad 303 and the terminals 903 dedicated for the testing in the package substrate. More specifically, a solder plating 702 is applied over the pads 303 to form the resist 701 (FIG. 10A). Then, the semiconductor element 30 is installed via a reflow soldering process in the side of the bump side 3a of the package substrate (FIG. 10B).

Figure 10C:
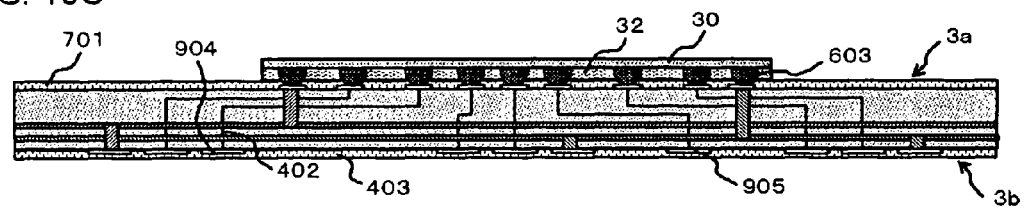
Figure 10D:
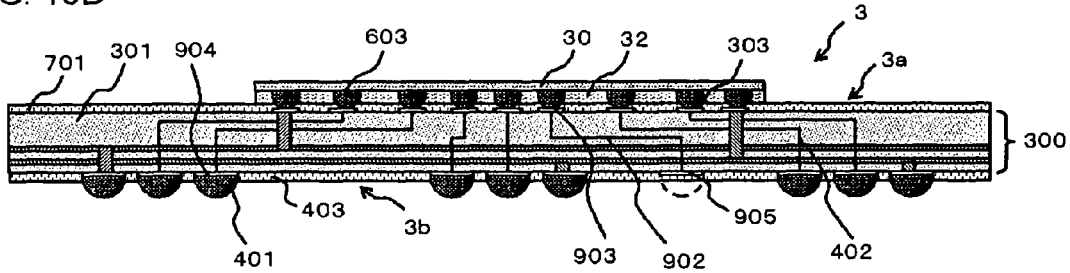

(ii) An operation for forming the external coupling terminals 401 on the pads 904 of package substrate, without forming the external coupling terminal 901 on the testing-dedicated pad 905 of the package substrate. More specifically, the spaces between semiconductor element 30 and resist 701 are filled with an underfill resin 32 (FIG. 10C). Finally, the external coupling terminals 401 are installed on the pads 904 to provide a finished product of the semiconductor device 3 (FIG. 10D). In addition to above, the testing-dedicated pad 905 has no external coupling terminal 401.

In addition to above, the semiconductor device 30 may be prepared by a semiconductor process. The lands (not shown) of the semiconductor device 30 in a wafer condition are provided with bumps 603 via a printing, a vapor deposition or a plating operations. This is diced into pieces to obtain the semiconductor devices 30 (semiconductor chips). Concerning the semiconductor device 30, the selected semiconductor device having the LSI that has been passed as non-defective in the inspection in the electrical testing for the semiconductor wafer 601 can be packaged.

Subsequently, the effects and the advantageous effects of the present embodiment will be described. According to the configuration of the adapter board 1, an additional insulating resin layer 305 is provided to the package substrate 300, so that vias 306 are formed in the through holes 308 formed in the positions corresponding to the pads 303 and the testing-dedicated pads 903, respectively, to cover the through holes 308 with the pads 307.

This allows supporting the pads 307 by the insulating resin layer 305 and the vias 306, achieving a creation of a coupling of the pads 303 with the pads 307 through the vias 306. Therefore, sufficient contact area with the probes 101 can be assured by the presence of the pads 307, while utilizing the pads 303 and the testing-dedicated pad 903 formed in the package substrate 300, allowing an easy alignment of the probes 101 with the land pads 307 and a prevention of a misalignment during the inspection. Thus, a reduction of the cost can be achieved even if the adapter board system is adopted, so that electrical characteristics of the semiconductor wafer 601 can be inspected with an improved efficiency.

Figure 9A:
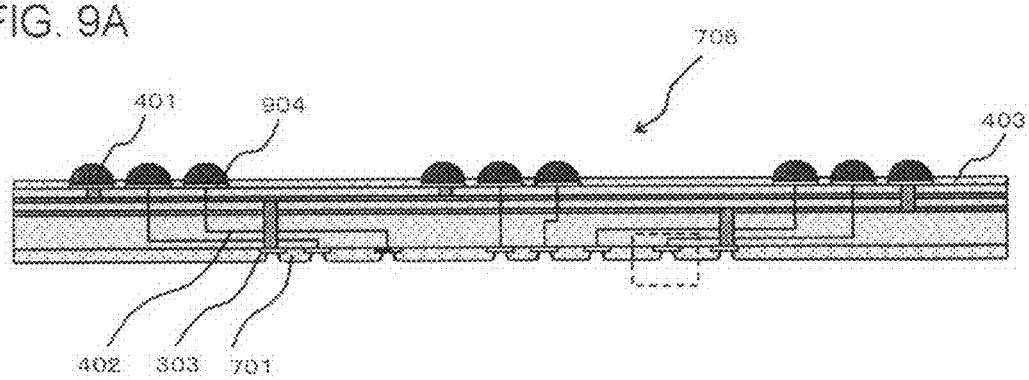
FIGS. 9A and 9B is a diagram, useful in describing a conventional adapter board.
Figure 9B:
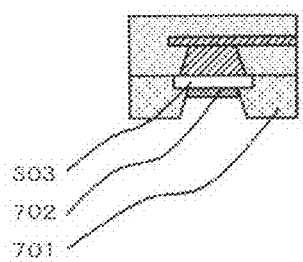

In a conventional adapter board 706 shown in FIGS. 9A and 9B, a misalignment between the probe heads and the plate may possibly cause defective contact between the upper end section 2a of the probe and the pad 303 during the installation of the probe heads to the plate on the probe card board. If the resist 701 partially covers the periphery of the pad 303 for the pad 303 of the package substrate 300 having smaller diameter, a slight misalignment causes an unwanted contact of the upper end section 2a of the probe with the resist 701, highly possibly causing no contact with the pad 303.

On the other hand, the testing of the semiconductor wafer 601 may be conducted at a higher temperature or at a lower temperature. In such case, the positions of the pads 303 and/or the probes are changed due to a thermal expansion or shrinkage. Therefore, even if an alignment of the pads 303 with the probes 101 are achieved at an ambient temperature, the aligned pattern may possibly not adopted at a higher temperature or at a lower temperature.

On the other hand, the resist 701 is not able to be removed in the configuration of the conventional adapter board 706, in order to prevent the pattern wiring formed on the surface of the semiconductor wafer from causing a disconnection and/or a short circuit. The resist 701 has sufficient ability to support the vias, and thus, even if the solder layer 702 is removed to form a through hole in the resist 701, a via cannot be formed in the through hole. Therefore, a pad that protrudes from the resist 701 cannot be formed.

Further, a direct utilization of the package substrate may cause problems of reduced antioxidation-ability of the pad and reduced contact-ability. In order to carry out the flip-chip mounting, solder is generally employed for the surface treatment for pad 303 to form the solder layer 702 as shown in FIGS. 9A and 9B. When it is employed as the adapter board in such condition, solder adheres to the end sections of the probes, and then the adhered solder is oxidized to cause a deterioration of the contact, leading to a measurement failure. In addition, the solder layer 702 is worn by repeating the touching, leading to a fear of exposing the surface of the pad 303. When the pad 303 is composed of copper, oxidization is progressed when it is exposed to fresh air, more considerably causing the problem of deterioration in the contact.

On the other hand, the adapter board 1 is configured that the insulating resin layer 305 is formed in the package substrate 300 as shown in FIG. 1 without employing a resist. Thus, larger dimension of the pad 307 may be presented as long as the spacing between the pads is accommodated. Since the pad 307 is formed to be convex against the surface of the package substrate 300, the end surface of the probe and the surface of the pad are prevented to be open, unless a misalignment is caused so that the upper end surface of the probe does not completely overlap the surface of the pad. Therefore, requirements for the probe position accuracy and the accuracy for installation alignment of the probes are reduced.

In addition, according to the configuration of the adapter board 1, the electroconductive protective film 801 may be applied over the pads 307. Therefore, suitable materials may be selected for the protective film to achieve an improved contact and an improved abrasion resistance. A use of the gold-plating process for the electroconductive protective film 801 allows ensuring an antioxidation of the pad and an improved contact.

As described above, according to the configuration of the adapter board 1, the package substrate 300 for the semiconductor element installation is utilized for a board for extending the inter-pad distance in the probe card used in the semiconductor wafer 601, in particular in the wafer test process for the flip-chip device, and the additional insulating resin layer 305 is employed, so that the dimensional area of the pads are increased. This allows providing an improved tolerance for the positional variation of the probe and an improved tolerance for the installation accuracy of the head. In addition, suitable material can be selected for the electroconductive protective film of the pad, so that an endurance of the pad 307 is improved, and a stable contact can be achieved. Further, the package substrate for installing the semiconductor can be utilized, so that the system is advantageous in the cost, as compared with the system of preparing a dedicated adapter board.

While the preferred embodiments of the present invention have been described above in reference to the annexed figures, it should be understood that the disclosures above are presented for the purpose of illustrating the present invention, and various modifications other than that described above are also available. For example, while the pads 307 may be formed individually for the respective pads 303, the pads 307 may alternatively be sequentially formed so as to be coupled to a plurality of pads 303 if it is an equipotential (GND).

It is apparent that the present invention is not limited to the above embodiment, and may be modified and changed without departing from the scope and spirit of the invention.

What is claimed is:

1. An adapter board, comprising:
   a package substrate, including a board body having a first surface and a second surface and also having a wiring formed in the interior thereof, a first land pad disposed on said first surface and a second land pad disposed on said second surface;
   an insulating layer formed over said first surface of said package substrate;
   a through hole formed in a position corresponding to said first land pad of said insulating layer;
   a conductive member formed in said through hole;
   a third land pad covering said through hole and having an exposed bump side without being covered with the insulating layer; and
   an external coupling terminal formed in said second land pad,
   wherein said first land pad is electrically coupled to said second land pad through said wiring, and
   said third land pad is electrically coupled to said first land pad through said conductive member and the adapter board further includes a second testing-dedicated pad for applying electrical signal in said second surface, wherein said first land pad contains a first testing-dedicated pad, wherein said first testing-dedicated pad is electrically coupled to said second testing-dedicated pad through said wiring, and wherein an external coupling terminal is formed in said second testing-dedicated pad.

2. The adapter board as set forth in claim 1, wherein said third land pad is covered with an electroconductive protective film.

3. The adapter board as set forth in claim 2, wherein said electroconductive protective film is a gold-plated film.

4. The adapter board as set forth in claim 1, wherein said third land pad is protruded over the surface of said insulating layer.

5. The adapter board as set forth in claim 1, wherein the dimensional area of said third land pad is larger than the dimensional area of said first land pad.

6. The adapter board as set forth in claim 1, wherein an inter-pad distance for said second land pads is larger than an inter-pad distance for said first land pads, and an inter-pad distance for said third land pads is equivalent to an inter-pad distance for said first land pads.

7. The adapter board as set forth in claim 1, wherein the third land pad is disposed above the insulating layer.

8. The adapter board as set forth in claim 1, wherein the third land pad is convex against the first surface of the package substrate.

9. The adapter board as set forth in claim 1, wherein the insulating layer is formed on the package substrate without a resist.

* * * * *